United States Patent
Chen et al.

(10) Patent No.: US 9,267,739 B2
(45) Date of Patent: Feb. 23, 2016

(54) PEDESTAL WITH MULTI-ZONE TEMPERATURE CONTROL AND MULTIPLE PURGE CAPABILITIES

(71) Applicant: Applied Materials, Inc., Santa Clara, CA (US)

(72) Inventors: Xinglong Chen, San Jose, CA (US); Jang-Gyoo Yang, San Jose, CA (US); Alexander Tam, Union City, CA (US); Elisha Tam, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 531 days.

(21) Appl. No.: 13/723,516

(22) Filed: Dec. 21, 2012

(65) Prior Publication Data

US 2014/0021673 A1    Jan. 23, 2014

Related U.S. Application Data

(60) Provisional application No. 61/673,067, filed on Jul. 18, 2012.

(51) Int. Cl.
*F28D 15/00* (2006.01)
*H01L 21/67* (2006.01)

(52) U.S. Cl.
CPC .......... *F28D 15/00* (2013.01); *H01L 21/67109* (2013.01)

(58) Field of Classification Search
CPC ... F28D 15/00; F28D 7/04; F28D 2021/0028; F28D 2021/0029; H01L 21/67109; H01L 23/473

USPC .............................. 269/289 R; 165/80.4, 80.5
See application file for complete search history.

(56) References Cited

U.S. PATENT DOCUMENTS

| | | | |
|---|---|---|---|
| 7,837,828 B2 | 11/2010 | Ikeda et al. | |
| 7,976,631 B2 | 7/2011 | Burrows et al. | |
| 2003/0159307 A1* | 8/2003 | Sago et al. | 34/107 |
| 2006/0222481 A1 | 10/2006 | Foree | |
| 2007/0235134 A1 | 10/2007 | Ilmuro | |
| 2009/0197418 A1 | 8/2009 | Sago et al. | |

OTHER PUBLICATIONS

International Search Report of PCT/US2013/048931 mailed Oct. 10, 2013, 9 pages.

* cited by examiner

*Primary Examiner* — Monica Carter
*Assistant Examiner* — Nirvana Deonauth
(74) *Attorney, Agent, or Firm* — Kilpatrick Townsend & Stockton LLP

(57) ABSTRACT

Substrate support assemblies for a semiconductor processing apparatus are described. The assemblies may include a pedestal and a stem coupled with the pedestal. The pedestal may be configured to provide multiple regions having independently controlled temperatures. Each region may include a fluid channel to provide a substantially uniform temperature control within the region, by circulating a temperature controlled fluid that is received from and delivered to internal channels in the stem. The fluid channels may include multiple portions configured in a parallel-reverse flow arrangement. The pedestal may also include fluid purge channels that may be configured to provide thermal isolation between the regions of the pedestal.

14 Claims, 7 Drawing Sheets

PEDESTAL WITH MULTI-ZONE TEMPERATURE CONTROL AND MULTIPLE PURGE CAPABILITIES

CROSS-REFERENCES TO RELATED APPLICATIONS

This application claims the benefit of U.S. Provisional Application No. 61/673,067, filed Jul. 12, 2012, and titled "PEDESTAL WITH MULTI-ZONE TEMPERATURE CONTROL AND MULTIPLE PURGE CAPABILITIES." The entire contents of which are hereby incorporated by reference for all purposes.

TECHNICAL FIELD

The present technology relates to components and apparatuses for semiconductor manufacturing. More specifically, the present technology relates to substrate pedestal assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Temperature fluctuations that may occur across the surface or through the depth of the supporting assembly may create temperature zones or regions across a substrate. These regions of varying temperature may affect processes performed on or to the substrate, which may often reduce the uniformity of deposited films or etched structures along the substrate. Depending on the degree of variation along the surface of the substrate, device failure may occur due to the inconsistencies produced by the applications.

Additionally, the structures housed within a semiconductor processing chamber may be affected by the processes performed within the chamber. For example, materials deposited within the chambers may deposit on the equipment within the chamber as well as on the substrate itself. Thus, for these and other reasons, there is a need for improved equipment and assemblies within semiconductor processing chambers. These and other needs are addressed by the present technology.

SUMMARY

Substrate support assemblies for a semiconductor processing apparatus are described. The assemblies may include a pedestal and a stem coupled with the pedestal. The pedestal may be configured to provide multiple regions having independently controlled temperatures. Each region may include a fluid channel to provide a substantially uniform temperature control within the region, by circulating a temperature controlled fluid that is received from and delivered to internal channels in the stem. The fluid channels may include multiple portions configured in a parallel-reverse flow arrangement. The pedestal may also include fluid purge channels that may be configured to provide thermal isolation between the regions of the pedestal.

The first and second fluid channels may be arranged in a coil pattern within the support assemblies in disclosed embodiments. Additionally, the stem may further include a heating means operable to maintain a temperature of the stem different from the first and second pedestal regions. The first and second fluid channels may be fluidly isolated from one another in order to provide temperature differentiation across the surface. The substrate support surface may additionally be of any number of geometries and may be circular. Within this circular design, the first region of the pedestal may be centrally located, and the second region may be an annular region surrounding the first region. Subsequent regions may additionally be provided.

In disclosed embodiments the pedestal and stem may be two separate components electrically isolated from one another. Additionally, the first and second portions of the first fluid channel may be disposed vertically from one another and may be substantially or directly vertically aligned. The support assemblies may additionally include a first purge channel defined within the pedestal and configured to provide a first purge flow path for a purge gas. The first purge channel may include a vertical isolation cavity defined between the first region and second region of the pedestal, and the isolation cavity may be configured to receive a portion of the purge gas. The pedestal portion of the assemblies may be formed by coupling one or more plates with each other, and the pedestal may comprise multiple plates in various embodiments. A first plate may comprise the substrate support surface, and a second plate may be located below the first plate and have areas defining at least part of the third and fourth portions of the second fluid channel, as well as at least a portion of the isolation cavity.

The pedestal may include at least one additional plate located below the first plate, or between the first and second plates, that includes areas defining the first and second portions of the first fluid channel. The at least one additional plate may further include areas defining at least part of the third and fourth portions of the second fluid channel, at least part of the isolation cavity, as well as the first purge channel. The at least one additional plate may be composed of at least two plates, such as a third and fourth plate. The third plate may be located below the first plate and include areas defining at least part of the first and second portions of the first fluid channel, at least part of the third and fourth portions of the second fluid channel, and a first portion of the isolation cavity. The fourth plate may be positioned below the third plate and include portions defining at least a portion of the first purge channel, as well as at least a second portion of the isolation cavity that is in fluid communication with the first portion of the isolation cavity defined by the third plate. The isolation cavity may be configured to produce a thermal barrier between the first region of the pedestal and the second region of the pedestal. The assemblies may still further include a second purge channel defined along an interface between the stem and the pedestal, and that is configured to provide a second purge flow path that is configured to produce a thermal barrier between the stem and the pedestal. The second purge channel may at least partially be defined by an additional purge distribution plate.

Substrate support assemblies are also described including a pedestal having a substrate support surface. The assemblies may additionally include a stem coupled with the pedestal opposite the substrate support surface that includes a pair of stem internal channels configured to deliver and receive a temperature controlled fluid to the pedestal. The assemblies may include a fluid channel defined within a central region of the pedestal coupled at an inlet section with one of the pair of stem internal channels, and be configured to receive the temperature controlled fluid from the stem internal channel. The fluid channel may further be coupled at an outlet section with the other of the pair of stem internal channels, and be configured to direct the temperature controlled fluid to the other stem internal channel. The fluid channel may include a first channel portion and a second channel portion between the inlet and the outlet sections, and the second channel portion may be disposed vertically from and coupled in parallel-reverse pattern with the first channel portion. The channel portions may be configured such that fluid received at the inlet section is directed through the first channel portion prior to flowing through the second channel portion and through the outlet section. The fluid channel may also be arranged in a coil pattern that is configured to direct the temperature controlled fluid from the inlet section radially outward through the pedestal. The stem of the assembly may further include a heating means separate from the stem internal channels, and be operable to maintain the stem at a temperature different from the pedestal. The first and second portions of the fluid channel may be disposed vertically from one another in disclosed embodiments, and the portions may be in direct vertical alignment. The pedestal may further include a purge channel having a distally located outwardly closed cavity defined within the pedestal at least partially below the fluid channel. The cavity may be located at a position radially outward from the pedestal defining a region of the pedestal. The purge channel may be configured to receive a pressurized fluid from a stem purge channel that is contained within the purge channel to create a fluid barrier within the pedestal throughout the purge channel. Additionally, the pedestal portion of the assemblies may be formed from a plurality of plates coupled with one another to form the pedestal.

Such technology may provide numerous benefits over conventional equipment. For example, temperatures across the pedestal surface may be maintained at more uniform temperatures, which may allow for improved processes across the surface of a substrate being processed. Additionally, providing an assembly capable of having different regions maintained at different temperatures may allow more precise operations to be performed, and may reduce the amount of material disposed on equipment surfaces. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The present technology includes improved pedestal designs for heating and cooling distribution during semiconductor processing operations. While conventional pedestals may control the general temperature of the substrate during operations, the presently described technology allows for improved control of the temperature characteristics across the entirety of the surface and exterior of the pedestal and stem. The technology allows for the pedestal to be controlled in multiple independent zones. In so doing, improved operations may be performed because a substrate residing on the pedestal can be maintained at a more uniform temperature profile across the entire surface. These and other benefits will be explained in detail below.

Figure 1:
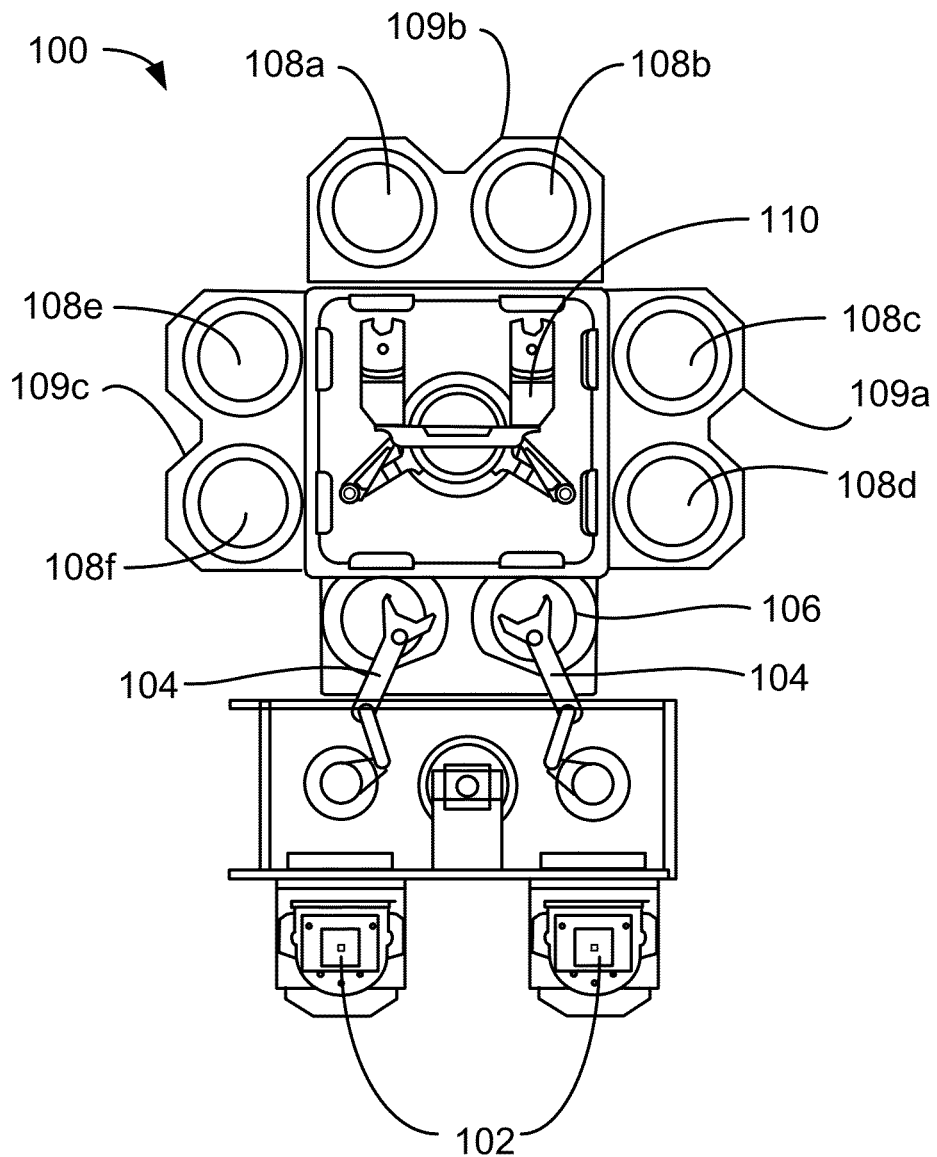
FIG. 1 is a top plan view of one embodiment of a processing tool.

FIG. 1 is a top plan view of one embodiment of a processing tool 100 used in exemplary semiconductor manufacturing processes, and in which a pedestal according to the present technology may be found. In the figure, a pair of FOUPs (front opening unified pods) 102 supply substrates of a variety of dimensions that may be received by robotic arms 104 and placed into a low pressure holding area 106 before being placed into one of the substrate processing sections 108a-f of the tandem process chambers 109a-c. A second robotic arm 110 may be used to transport the substrates from the holding area 106 to the processing chambers 108a-f and back.

The substrate processing sections 108a-f of the tandem process chambers 109a-c may include one or more system components for depositing, annealing, curing and/or etching films on a substrate. In one configuration, two pairs of the tandem processing sections of the processing chamber (e.g., 108c-d and 108e-f) may be used to deposit a flowable dielectric material on the substrate, and the third pair of tandem processing sections (e.g., 108a-b) may be used to anneal the deposited dielectric. In another configuration, the two pairs of the tandem processing sections of processing chambers (e.g., 108c-d and 108e-f) may be configured to both deposit and anneal a flowable dielectric film on the substrate, while the third pair of tandem processing sections (e.g., 108a-b) may be used for UV or E-beam curing of the deposited film. In still another configuration, all three pairs of tandem processing sections (e.g., 108a-f) may be configured to etch dielectric films deposited on the substrate.

In yet another configuration, two pairs of tandem processing sections (e.g., 108c-d and 108e-f) may be used for both deposition and UV or E-beam curing of the dielectric, while a third pair of tandem processing sections (e.g. 108a-b) may be used for annealing the dielectric film. It will be appreciated that additional configurations of deposition, annealing, and curing chambers for flowable dielectric films are contemplated by system 100.

In addition, one or more of the tandem processing sections 108a-f may be configured as a wet treatment chamber. These process chambers may include heating the dielectric film in an atmosphere that includes moisture. Thus, embodiments of system 100 may include wet treatment tandem processing sections 108a-b and anneal tandem processing sections 108c-d to perform both wet and dry anneals on the deposited dielectric film.

Figure 2:
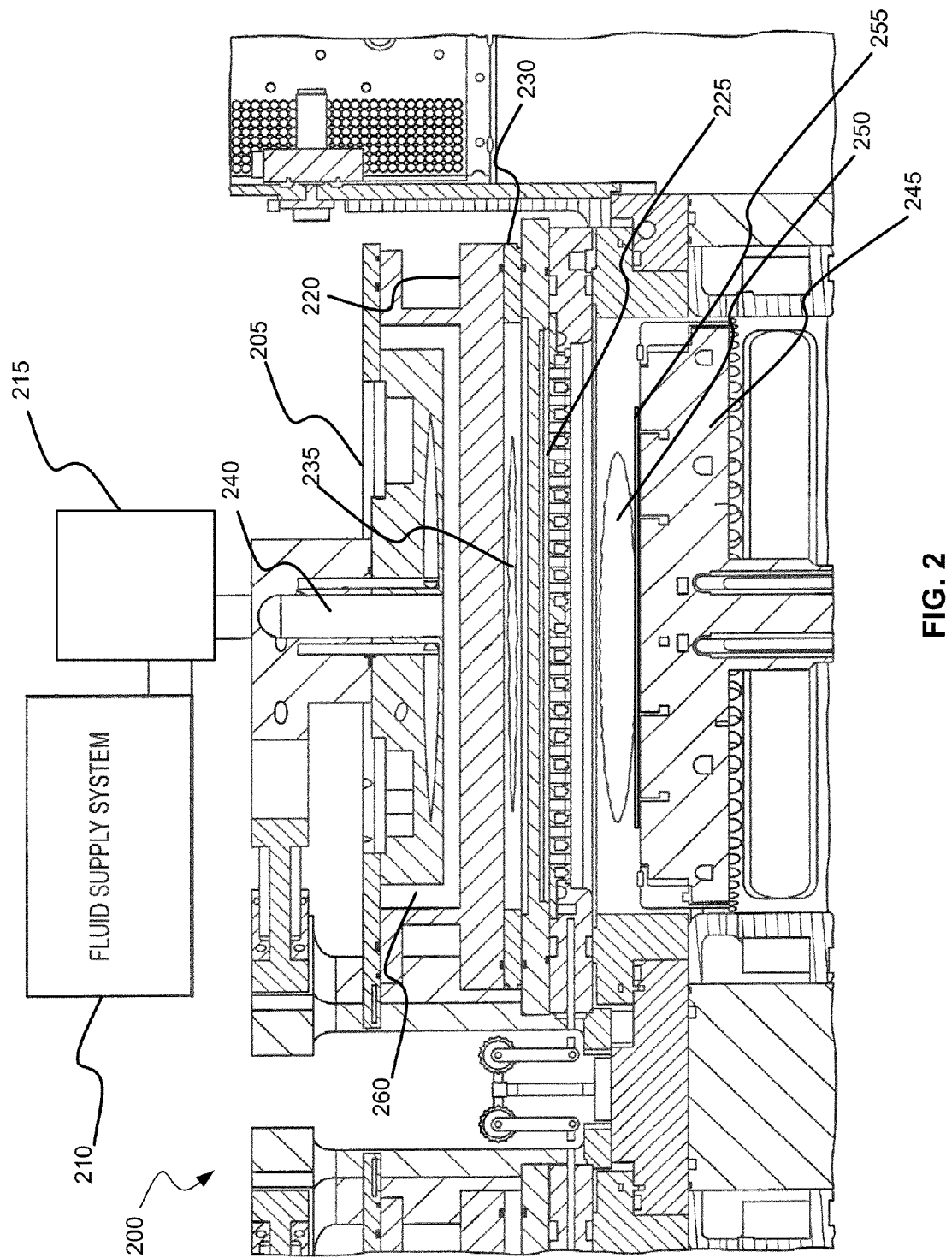
FIG. 2 is a schematic cross-sectional view of one embodiment of a processing chamber in which a pedestal according to the disclosed technology may be found.

FIG. 2 shows a simplified cross-sectional view of a processing system 200 according to embodiments of the present technology that may include partitioned plasma generation regions within the processing chamber. The processing system may optionally include components located outside the processing chamber 205, such as fluid supply system 210. The processing chamber 205 may hold an internal pressure different than the surrounding pressure. For example, the pressure inside the processing chamber may be about 10 mTorr to about 20 Torr during processing.

During operation, a process gas may be flowed into the first plasma region 235 through a gas inlet assembly 240. The process gas may be excited prior to entering the first plasma region 235 within a remote plasma system (RPS) 215. A lid 220, a showerhead 225, and a substrate support 245, having a substrate 255 disposed thereon, are shown according to disclosed embodiments. The lid 220 may be pyramidal, conical, or of another similar structure with a narrow top portion expanding to a wide bottom portion, or may be relatively flat as depicted. The lid 220 may include an applied AC voltage source and the showerhead 225 may be grounded, consistent with plasma generation in the first plasma region 235. An insulating ring 230 may be positioned between the lid 220 and the showerhead 225 enabling a capacitively coupled plasma (CCP) to be formed in the first plasma region 235.

The lid 220 may be a dual-source lid for use with a processing chamber according to disclosed embodiments. A fluid inlet assembly 240 may introduce a fluid, such as a gas, into the first plasma region 235. The fluid inlet assembly 240 may include two distinct fluid supply channels within the assembly. A first channel may carry a fluid, such as a gas, that passes through the RPS 215, while a second channel may carry a fluid, such as a gas, that bypasses the RPS 215. The first channel may be used for the process gas and the second channel may be used for a treatment gas in disclosed embodiments. The gases may flow into the plasma region 235 and be dispersed by a baffle (not shown). The lid 220 and showerhead 225 are shown with an insulating ring 230 in between, which allows an AC potential to be applied to the lid 220 relative to the showerhead 225.

A fluid, such as a precursor, may be flowed into the second plasma region 250 by embodiments of the showerhead 225 described herein. Excited species derived from the process gas in the plasma region 235 may travel through apertures in the showerhead 225 and react with the precursor flowing into the second plasma region 250 from the showerhead. Little or no plasma may be present in the second plasma region 250. Excited derivatives of the process gas and the precursor may combine in the region above the substrate.

Exciting the process gas in the first plasma region 235 directly, exciting the process gas in the RPS 215, or both, may provide several benefits. The concentration of the excited species derived from the process gas may be increased within the second plasma region 250 due to the plasma in the first plasma region 235. This increase may result from the location of the plasma in the first plasma region 235. The second plasma region 250 may be located closer to the first plasma region 235 than the RPS 215, leaving less time for the excited species to leave excited states through collisions with other gas molecules, walls of the chamber, and surfaces of the showerhead.

The uniformity of the concentration of the excited species derived from the process gas may also be increased within the second plasma region 250. This may result from the shape of the first plasma region 235, which may be more similar to the shape of the second plasma region 250. Excited species created in the RPS 215 may travel greater distances in order to pass through apertures near the edges of the showerhead 225 relative to species that pass through apertures near the center of the showerhead 225. The greater distance may result in a reduced excitation of the excited species and, for example, may result in a slower growth rate near the edge of a substrate. Exciting the process gas in the first plasma region 235 may mitigate this variation.

The processing gas may be excited in the RPS 215 and may be passed through the showerhead 225 to the second plasma region 250 in the excited state. Alternatively, power may be applied to the first processing region to either excite a plasma gas or enhance an already exited process gas from the RPS 215. While a plasma may be generated in the second plasma region 250, a plasma may alternatively not be generated in the second plasma region. In one example, the only excitation of the processing gas or precursors may be from exciting the processing gas in the RPS 215 to react with the precursors in the second plasma region 250.

The plasma generating gases and/or plasma excited species may pass through a plurality of holes (not shown) in lid 220 for a more uniform delivery into the plasma excitation region 235. Exemplary configurations include having the inlet 240 open into a gas supply region 260 partitioned from the plasma excitation region 235 by lid 220 so that the gases/species flow through the holes in the lid 220 into the plasma excitation region 235. Structural and operational features may be selected to prevent significant backflow of plasma from the plasma excitation region 235 back into the supply region 260, inlet 240, and fluid supply system 210. The structural features may include the selection of dimensions and cross-sectional geometry of the holes in lid 220 that deactivates back-streaming plasma. The operational features may include maintaining a pressure difference between the gas supply region 260 and plasma excitation region 235 that maintains a unidirectional flow of plasma through the showerhead 225.

The showerhead 225 may include a plurality of holes that suppress the migration of ionically-charged species out of the plasma excitation region 235 while allowing uncharged neutral or radical species to pass through the showerhead 225. These uncharged species may include highly reactive species that are transported with less reactive carrier gas through the holes. As noted above, the migration of ionic species through the holes may be reduced, and in some instances completely suppressed. Controlling the amount of ionic species passing through the showerhead 225 may provide increased control over the gas mixture brought into contact with the underlying wafer substrate, which in turn increases control of the deposition and/or etch characteristics of the gas mixture.

The plurality of holes in the showerhead 225 may be configured to control the passage of the activated gas (i.e., the ionic, radical, and/or neutral species) through the showerhead 225. For example, the aspect ratio of the holes (i.e., the hole diameter to length) and/or the geometry of the holes may be controlled so that the flow of ionically-charged species in the activated gas passing through the showerhead 225 is reduced. In embodiments where the showerhead 225 includes an electrically coupled ion suppressor with the showerhead, the holes in the ion blocker, which may be disposed above the showerhead, may include a tapered portion that faces the plasma excitation region 235, and a cylindrical portion that faces the showerhead. The cylindrical portion may be shaped and dimensioned to control the flow of ionic species passing to the showerhead. An adjustable electrical bias may also be applied to the showerhead 225 as an additional means to control the flow of ionic species.

Depending on whether a deposition or an etching process is performed, gases and plasma excited species may pass through the showerhead 225 and be directed to the substrate. The showerhead can further direct the flow of gases or plasma species. The showerhead may be a dual-zone showerhead that may include multiple fluid channels for directing the flow of one or more gases. The dual-zone showerhead may have a first set of channels to permit the passage of plasma excited species into reaction region 250, and a second set of channels that deliver a second gas/precursor mixture into the reaction region 250.

A fluid delivery source may be coupled with the showerhead to deliver a precursor that is able to bypass plasma excitation region 235 and enter reaction region 260 from within the showerhead through the second set of channels. The second set of channels in the showerhead may be fluidly coupled with a source gas/precursor mixture (not shown) that is selected for the process to be performed. For example, when the processing system is configured to perform an etch on the substrate surface, the source gas/precursor mixture may include etchants such as oxidants, halogens, water vapor and/or carrier gases that mix in the reaction region 250 with plasma excited species distributed from the first set of channels in the showerhead. Excessive ions in the plasma excited species may be reduced as the species move through the holes in the showerhead 225, and reduced further as the species move through channels in the showerhead.

The pedestal 245 may be operable to support and move the substrate or wafer 255. The distance between the pedestal 245 and the bottom of the showerhead 225 help define the reaction region 250. The pedestal 245 may be vertically or axially adjustable within the processing chamber 205 to increase or decrease the reaction region 250 and affect the deposition or etching of the wafer substrate by repositioning the wafer substrate with respect to the gases passed through the showerhead 225.

The pedestal 245 may also be configured with a heating element such as a resistive heating element to maintain the substrate at heating temperatures (e.g., about 90° C. to about 1100° C.). Exemplary heating elements may include a single-loop heater element embedded in the substrate support platter that makes two or more full turns in the form of parallel concentric circles. An outer portion of the heater element may run adjacent to a perimeter of the support platten, while an inner portion may run on the path of a concentric circle having a smaller radius. The wiring to the heater element may pass through the stem of the pedestal.

A dual-zone showerhead, as well as the processing system and chamber, are more fully described in patent application Ser. No. 13/251,714 filed on Oct. 3, 2011, which is hereby incorporated by reference for all purposes to the extent not inconsistent with the claimed features and description herein.

Figure 3:
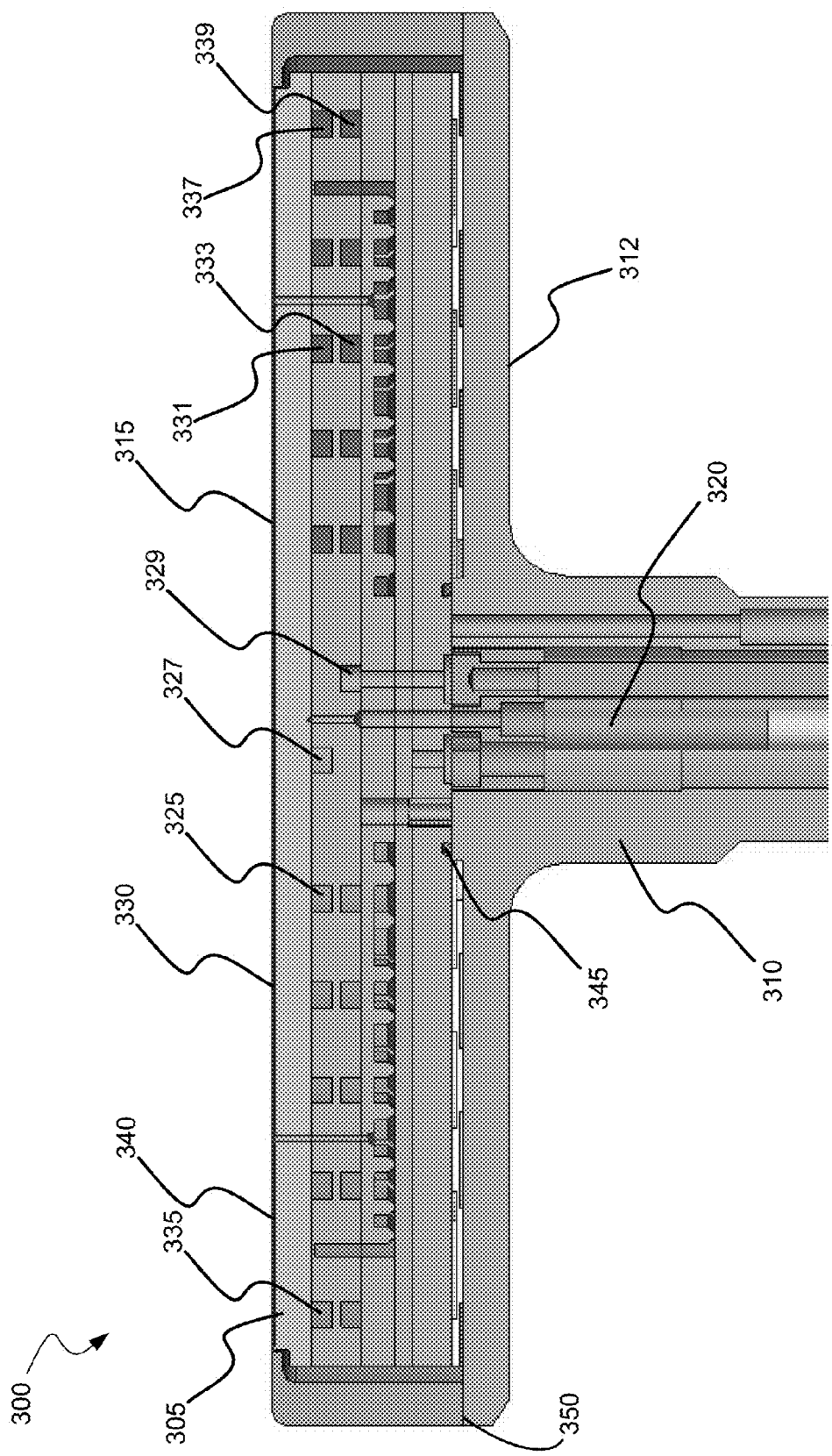
FIG. 3 illustrates a cross-sectional view of a substrate support assembly according to embodiments of the present technology.

Turning to FIG. 3, a cross-sectional view of a substrate support assembly 300 according to embodiments of the present technology is illustrated. The support assembly 300 includes a pedestal 305 and stem 310. The stem 310 may also include a base 312 upon which the pedestal 305 is located. The pedestal 305 may include a substrate support surface 315 that is configured to support a substrate during a semiconductor processing operation. The substrate support surface 315 may be made from a metal, such as aluminum, or a ceramic or other material, and may be treated or coated with other materials that provide improved corrosion resistance, improved contact with the substrate, etc.

The stem 310 may be attached to the pedestal 305 opposite the substrate support surface 315. The stem 310 may include one or more internal channels 320 configured to deliver and receive temperature controlled fluids, pressurized fluids, or gases to and from the pedestal 305. An exemplary stem 310 may include four internal channels 320 that may be divided into pairs. Alternative arrangements may include more or less channels, and may include 1, 2, 3, 4, 5, 6, 7, 8, 10, 12, etc., or more channels for fluid delivery. A first pair of internal channels 320 may be configured to deliver and receive, respectively through the channels, a first temperature controlled fluid to the pedestal 305. A second pair of internal channels 320 may be configured to deliver and receive, respectively through the channels, a second temperature controlled fluid to the pedestal 305. The stem may also include one or more heating means operable to maintain a temperature of the stem different from the temperatures maintained in the pedestal. For example, the stem may include a fluid circulation system jacketed around, or integrated within, the stem. Alternatively, the stem 310 may also be configured with a heating element such as a resistive heating element to maintain the stem at a particular temperature (e.g., about 90° C. to about 1100° C.). The wiring to the heater element may pass through the stem of the pedestal or be otherwise directed through the chamber. By maintaining the stem at a suitable temperature, it may be possible to limit or prevent deposition on the stem portion of the support assembly 300.

The first and second temperature controlled fluids may be delivered to the same or different regions of the pedestal through fluid channels located in the pedestal 305. For example, the first temperature controlled fluid may be delivered to a first fluid channel 325 within a first region 330 of the pedestal 305. The second temperature controlled fluid may be delivered to a second fluid channel 335 within a second region 340 of the pedestal 305. The two fluids may be the same or different fluids, and may be provided at the same or different temperatures in order to maintain the two regions 330, 340 at similar or different temperatures. For example, the second temperature controlled fluid may be delivered at a temperature greater than or less than the first temperature controlled fluid, which will allow the second region 340 to be at a higher or lower, respectively, temperature than the first region 330. This can be used to affect etching and deposition profiles across a wafer, and can also be used to affect how much deposition or etching occurs at different locations. Circulation of the temperature controlled fluids allows the substrate temperature to be maintained at relatively low temperatures, e.g., about −20° C. to about 150° C., as well as at much higher temperatures, e.g., about 90° C. to about 1100° C. The temperatures may alternatively be maintained at between about 0° C. and 100° C., less than or about 100° C., etc. Exemplary heat exchange fluids include ethylene glycol and water, but other fluids may be utilized. In alternative assemblies 300, a resistive heating element is disposed within the channels to provide heating energy for heating a substrate. In still another alternative, the fluid channels are configured to include both a resistive heating element as well as space for circulation of a temperature controlled fluid such that multiple options of temperature control may be afforded.

Each of the first and second fluid channels may be coupled with the stem internal channels 320 at both an inlet and an outlet for receiving and delivering the temperature controlled fluids. The temperature controlled fluids may then be circulated through the fluid channels to provide a substantially uniform temperature control in the pedestal regions. In some embodiments, the first and second fluid channels are fluidly isolated from one another. The fluid channels may be arranged in a variety of patterns including spiral, coil, or other geometric patterns that will circulate the temperature controlled fluids through the pedestal regions.

The fluid channel circulation may be similar between the first and second region, and will be explained herein with regard to the first region 330. The first fluid channel 325 may be coupled with one of a first pair of stem internal channels 320 at a first inlet 327 to receive the first temperature controlled fluid. The first fluid channel 325 may be coupled with the other of the first pair of stem internal channels 320 at a first outlet 329 to deliver the first temperature controlled fluid after it has been circulated through the first region 330 of the pedestal 305. The first fluid channel 325 may include a first portion 331 and a second portion 333 between the inlet 327 and outlet 329. The second portion 333 may be disposed vertically from the first portion 331, and in alternative embodiments may be located above or below the first portion 331. In alternative arrangements, the second portion 333 may be disposed horizontally from the first portion 331. The first and second portions may also be disposed in an exact vertical arrangement with each other, with the first portion 331 disposed directly above the second portion 333, for example. Alternatively, the second portion 333 may be displaced from a directly vertical relationship to either side.

The arrangement of the first and second portions of the first fluid channel may be such as to create one of a variety of flow patterns for the first temperature controlled fluid. In one embodiment, the first and second portion are arranged to produce a parallel-reverse flow pattern for the first temperature controlled fluid. Specifically, the temperature controlled fluid, after being received at the first inlet 327, may flow through the first portion of first fluid channel from a location proximate to the stem internal channels outwardly to a distal portion of the first region 330. The temperature controlled fluid may then be transferred between the first and second portions of the first fluid channel and flow from a distal portion of the first region 330 inwardly to a location proximate to the stem internal channels. The temperature controlled fluid may then be delivered to the stem internal channels 320 at the first outlet 329.

Providing a parallel-reverse flow arrangement where the two channels are in close proximity may provide improved temperature control by producing a more uniform temperature profile across the substrate support surface. For example, when the channels are in direct vertical alignment as shown, general areas of fluid flow may average to a uniform temperature. As fluid is flowed through the channels, heat may be dissipated or absorbed, depending on the temperature of the fluid. As the temperature of the fluid changes, the temperature of the pedestal may not remain uniform at all locations. However, when a parallel-reverse flow arrangement of vertically aligned channels is provided, fluid temperature averaging may occur. For example, when the fluid is used for cooling, the point of entry may have the lowest fluid temperature, and the point of exit may have the highest fluid temperature. Accordingly, because these portions of the channel may be in close proximity, the fluid may provide a particular temperature within that region. At a distal portion of the region, the fluid may be at a temperature between the fluid temperatures at the inlet and outlet, and as the fluid reverses flow at the distal area, the particular temperature within that region may be similar to the averaged temperature near the stem. Accordingly, a more uniform temperature profile across the pedestal may be provided based on the fluid rate of flow and the channel orientation, which may not be available in conventional designs.

Although several of the components of the second fluid channel 335, including the inlet and outlet, are not shown in FIG. 3 for the sake of clarity, the second fluid channel 335 may be arranged in the second region 340 in a similar fashion. For example, the second fluid channel 335 may be configured to provide substantially uniform temperature control within the second region 340 of the pedestal 305. The second fluid channel 335 may be coupled with a second inlet to receive the second temperature controlled fluid from one of a second pair of stem internal channels 320, and coupled with a second outlet to deliver the second temperature controlled fluid to the other of the second pair of stem internal channels 320. The second fluid channel may include a third portion 337, and a fourth portion 339, where the third portion 337 is disposed vertically from and arranged in a parallel-reverse pattern with the fourth position 339. In this way, the fluid received at the second inlet may be circulated through the third portion 337 prior to flowing through the fourth portion 339, and then through the second outlet. The circulation of fluid, and the arrangement of the channel, may be similar to that of the first fluid channel, or may be one of the alternative arrangements discussed above. As with the first fluid channel, the third and fourth portions of the second fluid channel may be disposed vertically from one another, or in an alternative configuration. The third and fourth portions may also be disposed in an exact vertical arrangement with each other, with the third portion 337 disposed directly above the fourth portion 339, for example. Alternatively, the fourth portion 339 may be displaced from a directly vertical relationship to either side. In yet another alternative, the fourth portion 339 may be disposed above the third portion 337 of the second fluid channel 335, or the direction of flow may be reversed. Although FIG. 3 shows a single loop for the second fluid channel, any number of loops may be provided based on the channel orientation and dimensions as well as the pedestal dimensions. As with the first fluid channel, the second fluid channel may include any number of connected or spiraled rings around the region, and may in different embodiments include one or more rings and up to or greater than 3, 4, 5, 6, 7, 8, 9, 10, etc. or more loops of the channel.

The substrate support surface 315 may be of a variety of shapes including circular, elliptical, or other geometric shapes. One exemplary pedestal of the technology is substantially circular, with the first region 330 centrally located on the pedestal, and the second region 340 being of an annular shape and surrounding the first region. Each region may also be of a similar or different outer shape than the other. Additional regions may similarly be developed as portions of a region with separate fluid channels, or additional annular sections disposed radially outward from one another.

The pedestal 305 and stem 310 may be isolated from one another on the assembly 300. For example, at contact points 345 and 350, additional material may be disposed that allows the pedestal 305 and stem 310 to be electrically and/or thermally isolated from one another. At a first contact position 345, an o-ring, ceramic ring, or other insulative material may be positioned between the pedestal 305 and stem 310 so that the two portions of the assembly 300 are not in direct, or are in limited, physical contact. Similarly, at contact position 350 an o-ring, ceramic ring, or other insulative material may be positioned between the pedestal 305 and stem 310. One benefit to this arrangement, is that the stem may be maintained at a temperature that is significantly higher, for example, than the pedestal such that the substrate may be kept at a relatively low temperature during a deposition operation, but the stem may be kept at a higher temperature that limits deposition on the surface of the assembly 300. By providing thermal isolation between the sections, the temperature of the stem may not impact or may minimally impact the temperature of the substrate at any location. Additionally, the material utilized at contact position 350 may be a material that is electrically insulative, but may provide conductive heat transfer such that the edge of pedestal 305 may be heated similar to the stem 310, but is electrically isolated from the stem.

The substrate support surface 315 may be one component plate of the pedestal assembly 320, which may include a plurality of plates bonded, welded, fused, or otherwise coupled with each other. In an exemplary embodiment, the pedestal assembly 320 includes five plates, and in alternative embodiments, the pedestal assembly includes less than five plates, more than five plates, at least three plates, etc. The substrate support surface 315 may be the first plate of the assembly. The pedestal assembly 320 may include a second plate which at least partially defines the fluid channels. The plate arrangement and configuration is described further below.

Figure 4:
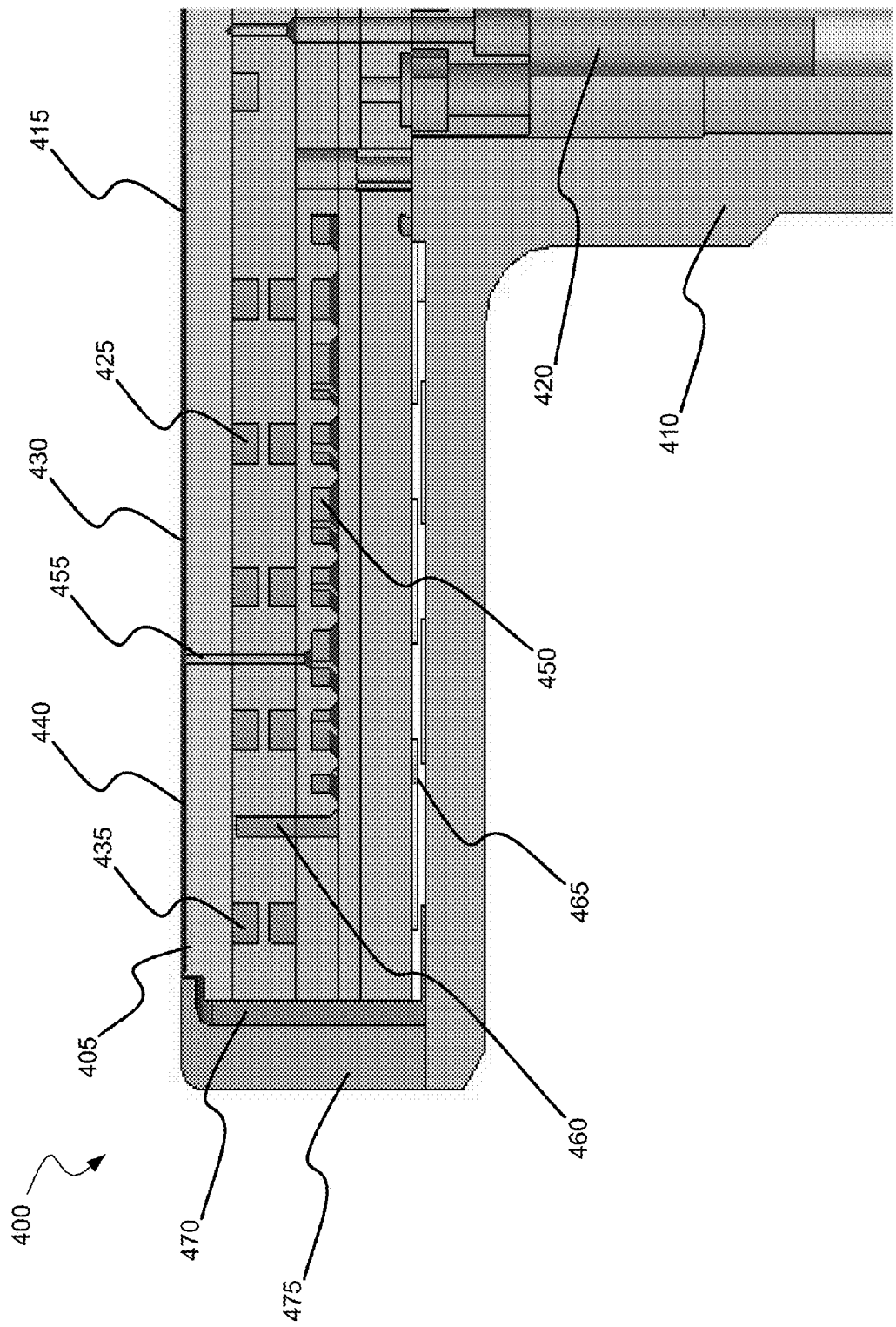
FIG. 4 shows a partial cross-sectional view of a substrate support assembly according to embodiments of the present technology.

FIG. 4 shows a partial cross-sectional view of a substrate support assembly 400 according to embodiments of the present technology. The assembly 400 may include similar components as described above with regard to FIG. 3. As shown, assembly 400 includes pedestal 405 and stem 410. The pedestal may include a substrate support surface 415 as previously discussed. The pedestal 405 may include multiple regions, which may include, for example, a first region 430 and a second region 440. Each region may include fluid channels that circulate a temperature controlled fluid configured to heat or cool the pedestal 405 to a predetermined temperature. The channels may alternatively, or additionally, include heating elements that may allow for resistive heating to be provided through the channels for further adjustment of the pedestal 405 temperature. The first region 430 may include a first channel 425, and the second region 440 may include a second channel 435. As discussed previously, the first and second channels may be fluidly isolated such that a different temperature controlled fluid may be circulated through each of the first and second regions. In one example, the second region may be maintained at about 100° C., while the first region may be maintained at about 50° C., or vice versa. Any particular temperature in the ranges previously described can be maintained separately in either of the first or second regions. In this way, multiple temperature arrangements may be utilized with each region being maintained at the same or a different temperature than the other region.

The pedestal 405 may also include one or more purge channels defined within the pedestal, and configured to provide purge flow paths. For example, a first purge flow path 450 may be defined by a portion of the pedestal 405. An exemplary pedestal 405 may include a plurality of bonded plates, which may include a plate defining the first purge flow path 450. The first purge flow path 450 may circulate a purge fluid throughout the pedestal that is evacuated through a plurality of purge outlets 455 defined in the pedestal 405. Although FIG. 4 illustrates one purge outlet 455, any number of purge outlets may be included in different configurations, and may be included in one or more rings of outlets within the pedestal. This feature will be discussed in more detail with reference to FIG. 5 below.

The first purge path 450 may be configured in any number of patterns within the pedestal 405. For example, the first purge path 450 may be configured in a coil pattern throughout the pedestal 405 in order to provide thermal isolation between the substrate support surface 415 and the stem 410 that may be heated as described above. Alternatively, a plurality of straight channels may be formed in the pedestal that direct a purge fluid directly to the purge outlets 455. Many different variations may be provided with the first purge channel 450, and may be arranged to provide a uniform purge flow across the pedestal. A purge fluid may be delivered from internal channels 420 in the stem 410, through the first purge channel 450, and out through purge outlets 455. The purge fluid may be a gas, including an inert gas, which is utilized to limit or prevent the formation of process byproducts within holes or channels of the substrate support surface 405. When deposition and/or etch processes are performed, byproducts of the process will routinely condense on areas within the substrate processing chamber, including on the substrate support assembly. When these byproducts accumulate on and within the substrate support surface 415, a subsequent substrate positioned on the surface may tilt, which can result in non-uniform deposition or etching. A purge gas delivered through the pedestal may be capable of dislodging and removing reactants from the substrate support surface.

The first purge channel 450 may additionally include a vertical isolation cavity 460 at a distal portion of the first purge channel 450. The vertical isolation cavity may be located at the periphery of the first region 430, and may be configured to receive a portion of the purge gas flow through the first purge channel 450, where the portion of purge gas is maintained in the isolation cavity 460 to provide thermal isolation between the first region 430 and the second region 440. In some arrangements, multiple purge channels are included to separately deliver gas to the isolation cavity 460 and the purge outlets 455. The channel or channels coupled with the isolation cavity 460 may be outwardly closed, such that the channel may be pressurized with fluid. A pressurized gas or pressurized fluid may be delivered to the isolation cavity, or pressurized within the cavity to provide a barrier or temperature curtain at the location of the isolation cavity. The isolation cavity 460 may be arranged as a channel that may separate the first and second regions 430, 440 around the entire pedestal. The purge gas or fluid may be heated or cooled to be delivered to the isolation cavity 460 such that it does not affect the temperature control of the temperature controlled fluids being circulated in the pedestal regions. Alternatively, the purge gas may be delivered at a temperature selected to adjust the temperature profile across the pedestal. In an exemplary pedestal, the isolation cavity 460 may be distributed across multiple plates of the pedestal. For example, the substrate support surface may be a first plate in the pedestal, and the first and second fluid channels 425, 435 may be at least partially defined in the second plate of the pedestal. The second plate may also at least partially define a first portion of the isolation cavity 460. The third plate may at least partially define the first purge channel 450 as well as a second portion of the isolation cavity 460 that is in fluid communication with the first portion of the isolation cavity defined by the second plate. In this way, the isolation cavity 460 may be utilized by delivering a portion of the purge gas to the cavity that may create a thermal barrier between the first and second fluid channels 425, 435, and between the first region 430 and the second region 440 of the pedestal 405.

The pedestal 405 may also include a second purge channel 465 that may be defined along an interface between the stem 410 and the pedestal 405. The second purge channel 465 may be configured to provide a second purge flow path for a purge gas that may produce an additional thermal barrier between the stem 410 and the pedestal 405. Accordingly, in one example, heat applied to the stem 410 to limit the amount of deposition of process byproducts may not affect the temperature control scheme applied through the pedestal 405. The second purge channel 465 may additionally include a second isolation cavity and purge outlet 470. The second isolation cavity and purge outlet 470 may be configured to receive a portion of purge gas delivered through the second purge channel 465, and may provide additional thermal isolation between the edge of the pedestal 475, and the second region 440 of the pedestal 405. Accordingly, the edge of the pedestal 475 may be heated in a fashion similar to the stem 410 in order to reduce the amount of byproduct deposition on the equipment, while providing a barrier to the pedestal 405 such that a uniform temperature profile may be more readily provided on the substrate support surface 415 in the second region 440.

The second isolation cavity 470 may function and be arranged in a similar fashion as the first isolation cavity 460. Purge gas or fluid may be delivered from internal channels 420 in the stem 410, and may be the same or different internal channels 420 as those delivering purge gas to the first purge channel 450. The purge gas delivered to the first and second purge channels 450, 465 may be the same or different in alternative embodiments. The purge gas may be delivered through the second purge channel 465 and into the second isolation cavity 470, prior to being expelled through the purge outlet at the top of the isolation cavity 470. The purge outlet at the top of isolation cavity 470 may be similar to the outlets 455 through which the first purge gas is delivered. Alternatively, a space may be created around the entirety of the top of the second isolation cavity 470 for the flow of purge gas. Alternatively, second isolation cavity 470 may be outwardly closed such that fluid buildup or pressurization may be performed in the second isolation cavity providing an enhanced thermal barrier at the external edge of the pedestal.

Figure 5:
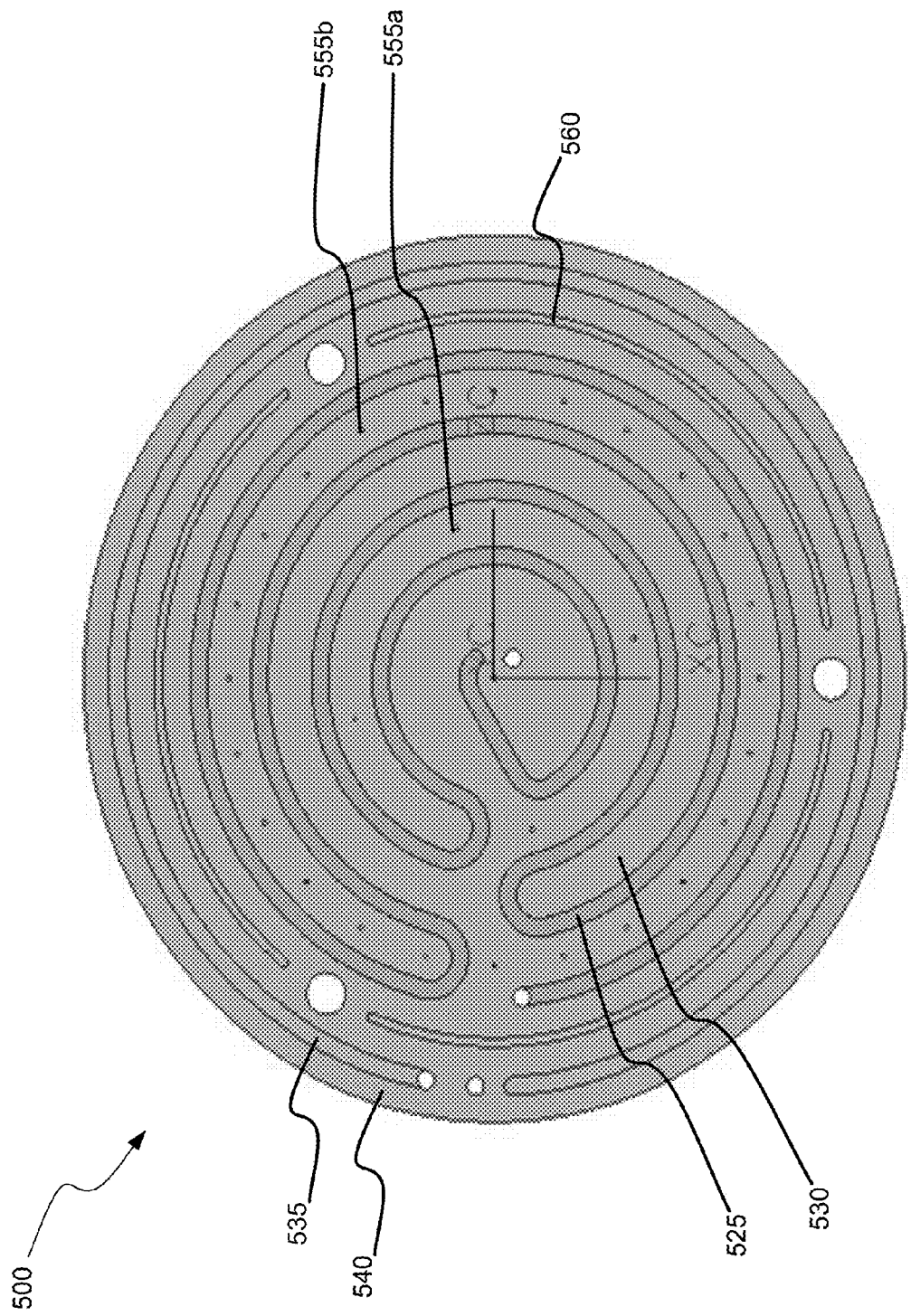
FIG. 5 illustrates a top plan view of a component plate of a pedestal according to embodiments of the present technology.

FIG. 5 illustrates a top plan view of a component plate 500 of a pedestal according to embodiments of the present technology. Plate 500 may be one of several component plates forming the pedestal. Plate 500 includes a first fluid channel 525 disposed within a first region 530, as well as a second fluid channel 535 disposed within a second region 540. The first fluid channel is arranged in a coil pattern, but can alternatively be arranged in a spiral, or other geometric pattern for circulation of a temperature controlled fluid. FIG. 5 illustrates a first portion of the channels, i.e., a top portion, but the plate may additionally define a second portion of the channels underneath. The top and bottom portions may be mirror images of one another, or may be a reverse pattern. In one exemplary plate 500, a temperature controlled fluid is delivered through the center of the plate to the first fluid channel 525 and delivered outwardly toward a distal position in the first fluid channel 525. The temperature controlled fluid may then be transferred to the bottom portion of the fluid channel (not shown) where it is circulated in a parallel-reverse pattern in comparison to the top portion of the fluid channel 525 back toward the center of the plate. The receiving and delivering of the temperature controlled fluid to the first fluid channel may occur through connections with internal channels of the stem of the support assembly.

Plate 500 also includes second fluid channel 535 arranged in a coil around the second region 540 of the plate 500, for circulation of a temperature controlled fluid that may be the same or different than the temperature controlled fluid delivered through the first fluid channel 525. Although shown in a single pass arrangement multiple passes or coil configurations may be utilized depending on the size of the plate 500. Second fluid channel 535 may also include a second portion on the underside of the plate (not shown), to provide a parallel-reverse circulation arrangement of a second temperature controlled fluid.

Plate 500 also may include an isolation cavity 560 that can be utilized to produce a thermal barrier between the first region 530 and the second region 540 of the plate 500. The isolation cavity may be configured to receive a purge fluid that may fill the isolation cavity 560. The cavity 560 may be arranged in a single channel, or in multiple channels as shown in FIG. 5. When assemblies including multiple regions are utilized, the pattern of the fluid channel may affect the ability to include multiple regions. For example, by providing a coiled pattern such as shown in FIG. 5 for first fluid channel 525, an area is provided between the coils allowing access to be provided to the second fluid channel 535. A spiral channel, for example, may also be utilized for the first fluid channel 525, but such a configuration may block access to the second fluid channel, where the two channels may otherwise intersect. If identical fluids are being provided, this intersection may be provided in the channel scheme, but if different fluids or fluids of different temperature are being utilized, such an intersecting arrangement may not be practical.

Plate 500 may still further include purge outlets 555 that may be utilized to remove, limit, or prevent process byproducts from being deposited on the pedestal substrate support surface. The purge outlets 555 may be configured in one or more rings, or alternatively disposed in various positions across the plate 500. As illustrated in FIG. 5, as one example, the outlets are positioned in two rings, but any number of rings may be used including 0, 1, 2, 3, 4, 5, 6, 7, 8, etc., or more rings. As illustrated in the embodiment shown in FIG. 5, an inner ring includes purge outlets 555a, and an outer ring includes purge outlets 555b. Any number of outlets may be arranged on the plate 500. As illustrated, the inner ring may include about 12 or less purge outlets 555a. Alternatively, the inner ring may include less than or about 10, 8, 6, 4, or 2 outlets 555a, and in some embodiments, an inner ring of purge outlets 555a may not be included. Additionally, the outer ring may include more than, about 48, or less purge outlets 555b. Alternatively, the outer ring may include less than or about 40, 32, 24, 20, 16, 12, 8, 4, or 2 purge outlets 555b. Again, in some plate configurations, an outer ring of purge outlets 555b may not be included. Additional rings may also be utilized that include the same or a different number of purge outlets 555 as the inner and outer ring described.

Figure 6:
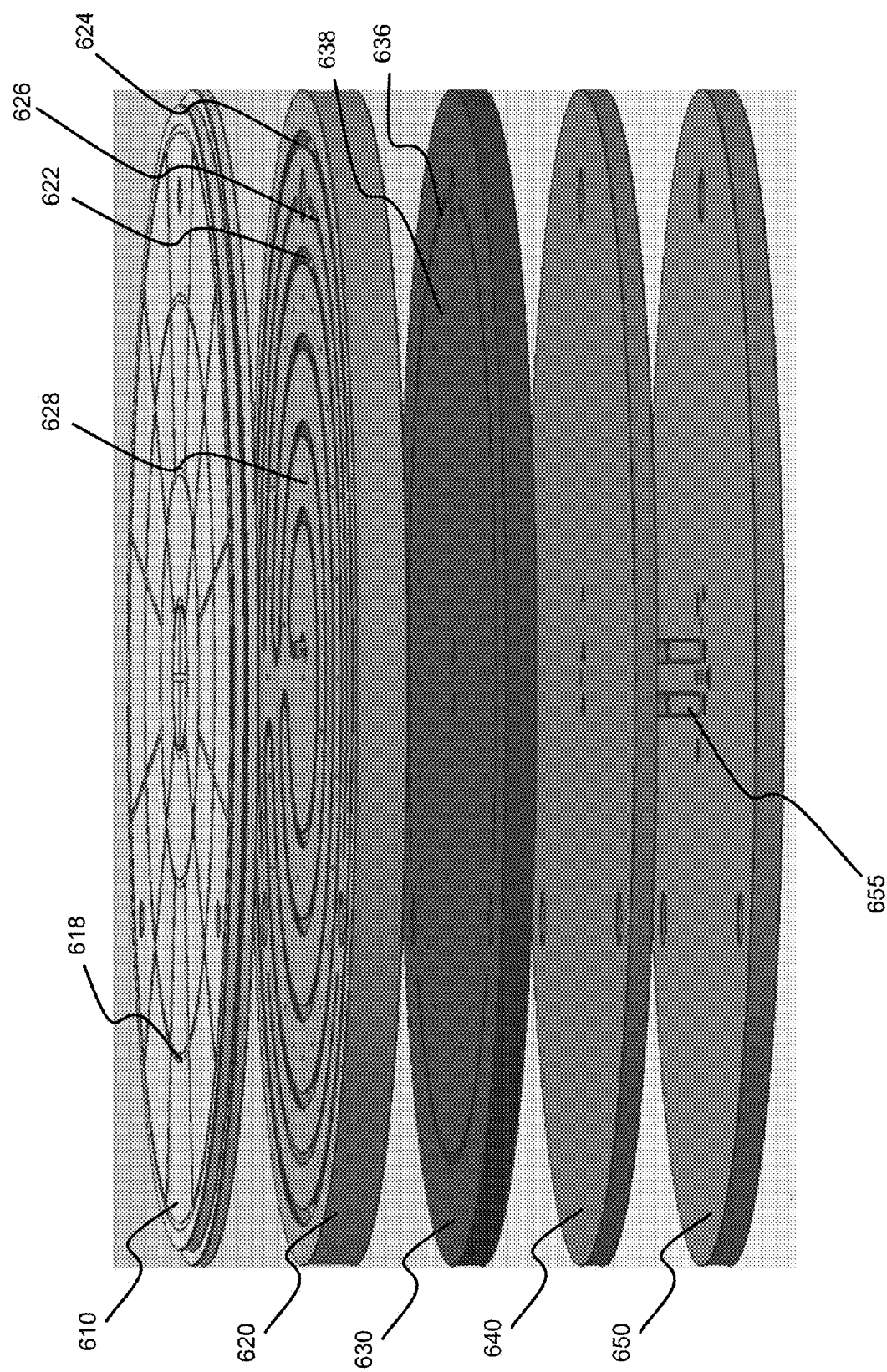
FIG. 6 shows an exploded perspective view of component plates of a pedestal according to embodiments of the present technology.

FIG. 6 shows an exploded perspective view of component plates of a pedestal according to embodiments of the present technology. As illustrated in the figure, five component plates are used, but more or less plates may be utilized in different embodiments of the technology. First plate 610 may comprise the substrate support surface on which a substrate may be positioned for processing. The plate may include at least a portion of purge gas outlets 618. Below first plate 610 may be a second plate 620. The second plate 620 may include areas defining at least part of the first and second portions of the first fluid channel 622, at least part of the third and fourth portions of the second fluid channel 624, and at least a first portion of the first purge channel 626. The second plate 620 may additionally include portions of the purge outlets 628 distributed across the plate.

Below second plate 620 may be a third plate 630. Third plate 630 may include areas defining at least a second portion of the first purge channel 636. The portion of the first purge channel 636 may be configured to be in fluid communication with the first portion of the first purge channel 626 defined by the second plate 620. The third plate may also include portions of the purge outlets 638 distributed across the plate. Below the third plate 630 may be a fourth plate 640. The fourth plate may provide additional insulation between the substrate support surface and the stem, and may additionally at least partly define the first purge channel that may be at least partly disposed on the backside of the third plate 630. Finally, a fifth plate 650 may be located below the fourth plate. The fifth plate may provide still additional thermal isolation between the substrate support surface and the stem, and in some embodiments, the fifth plate may include areas defining at least part of the third and fourth portions of the second fluid channel 655. The second temperature controlled fluid may be delivered from the stem internal channels, as described previously, and may be circulated across the fifth plate to connections (not shown) that deliver the temperature controlled fluid up to the second plate 620 for circulation through the second region of the pedestal. Each of the plates 620, 630, 640, and 650 may include additional connections through which the first temperature controlled fluid may be delivered to the first fluid channel 622 in second plate 620.

Figure 7:
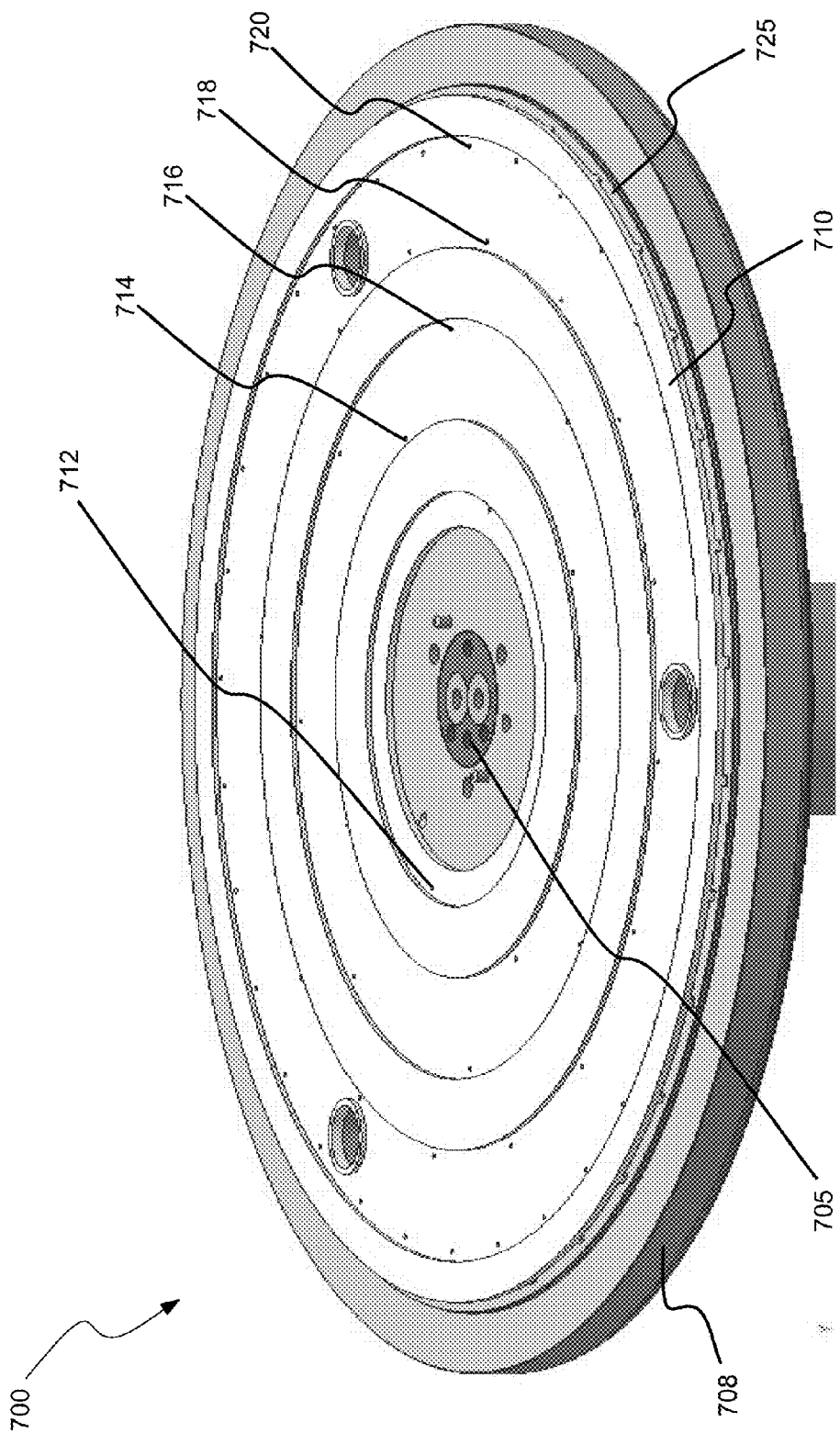
FIG. 7 illustrates a top perspective view of a component plate of a pedestal according to embodiments of the present technology.

FIG. 7 illustrates a top perspective view of a component plate of a pedestal 700 according to embodiments of the present technology. As illustrated, pedestal 700 may further include a purge distribution plate 710 that at least partially defines the second purge channel described previously. The distribution plate 710 may be made of a ceramic, or other material that may have a low thermal conductivity. The second purge channel may provide thermal isolation between the pedestal and stem, to improve the uniformity of the temperature profile across a substrate. When included below pedestal component plates, as illustrated in one example in FIG. 6, the second purge channel may be fully defined. A plurality of orifices may be utilized to further define the flow path of a purge gas within the second purge channel.

For example, purge gas may be delivered up through the stem through internal channels 705. The purge gas may then proceed under the fifth plate of the exemplary design of FIG. 6, or a bottom plate, to initial orifices 712 of purge distribution plate 710. The purge gas may flow through the orifices 712 and under the purge distribution plate 710 to an area that may be at least partially defined by stem base 708. The purge gas may flow back up through orifices 714, down through orifices 716, up through orifices 718, down through orifices 720, and then the purge gas may be delivered to the second isolation cavity 725. The purge distribution plate may include a greater or a fewer number of orifice paths depending on the application. The purge distribution plate may be made of a metal, ceramic, plastic, or other material that may facilitate flow of the purge gas, and/or minimize heat transfer between the stem and the pedestal.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a dielectric material" includes a plurality of such materials, and reference to "the application" includes reference to one or more applications and equivalents thereof known to those skilled in the art, and so forth.

Also, the words "comprise", "comprising", "contains", "containing", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A substrate support assembly comprising:
    a pedestal having a substrate support surface configured to support a substrate during a substrate processing operation; a stem attached to the pedestal opposite the substrate support surface, the stem having a first pair of stem internal channels configured to deliver and receive a first temperature controlled fluid to the pedestal and a second pair of stem internal channels configured to deliver and receive a second temperature controlled fluid to the pedestal;
    a first fluid channel within a first region of the pedestal to provide substantially uniform temperature control within the first region, the first fluid channel coupled at a first inlet to receive the first temperature controlled fluid from one of the first pair of stem internal channels, coupled at a first outlet to deliver the first temperature controlled fluid to the other of the first pair of stem internal channels, and including a first portion and a second portion between the inlet and the outlet, wherein the second portion is disposed vertically from and arranged in a parallel-reverse pattern with the first portion such that fluid received at the first inlet flows outwardly through the first portion prior to flowing to an outward section of the second portion and through the second portion inwards to the first outlet; and a second fluid channel within a second region of the pedestal to provide substantially uniform temperature control within the second region, the second fluid channel coupled at a second inlet to receive the second temperature controlled fluid from one of the second pair of stem internal channels, coupled at a second outlet to deliver the second temperature controlled fluid to the other of the second pair of stem internal channels, and including a third portion and a fourth portion between the inlet and the outlet, wherein the third portion is disposed vertically from and arranged in a parallel-reverse pattern with the fourth portion such that fluid received at the second inlet flows outwardly towards an outward section of the third portion prior to flowing to an outward section of the fourth portion and through the fourth portion inwards to the second outlet.

2. The substrate support assembly of claim 1, wherein the first and second fluid channels are each arranged in a coil pattern.

3. The substrate support assembly of claim 1, wherein the stem further comprises a heating means operable to maintain a temperature of the stem different from the first and second pedestal regions.

4. The substrate support assembly of claim 1, wherein the first and second fluid channels are fluidly isolated from each other.

5. The substrate support assembly of claim 1, wherein the substrate support surface is circular, and wherein the first region is centrally located, and the second region is an annular region surrounding the first region.

6. The substrate support assembly of claim 1, wherein the pedestal and stem are two separate components electrically isolated from one another.

7. The substrate support assembly of claim 1, wherein the first and second portion of the first fluid channel are disposed vertically from each other in direct vertical alignment.

8. The substrate support assembly of claim 1, wherein the third and fourth portion of the second fluid channel are disposed vertically from each other in direct vertical alignment.

9. The substrate support assembly of claim 1, further comprising a first purge channel defined within the pedestal and configured to provide a first purge flow path for a purge gas, wherein the first purge channel includes a vertical isolation cavity defined between the first region and the second region of the pedestal, and the isolation cavity is configured to receive a portion of the purge gas.

10. The substrate support assembly of claim 9, wherein the pedestal comprises multiple plates, and wherein:
 a first plate comprises the substrate support surface,
 at least one plate located below the first plate comprises areas defining the first and second portions of the first fluid channel, at least part of the third and fourth portions of the second fluid channel, at least part of the isolation cavity, and the first purge channel, and
 a second plate located below the first plate comprises areas defining at least part of the third and fourth portions of the second fluid channel, and at least part of the isolation cavity.

11. The substrate support assembly of claim 10, wherein the at least one plate comprises at least two plates including:
 a third plate located below the first plate and comprising areas defining at least part of the first and second portions of the first fluid channel, at least part of the third and fourth portions of the second fluid channel, and a first portion of the isolation cavity; and
 a fourth plate located below the third plate and comprising areas defining at least a portion of the first purge channel, as well as at least a second portion of the isolation cavity that is in fluid communication with the first portion of the isolation cavity defined by the third plate.

12. The substrate support assembly of claim 9, wherein the isolation cavity produces a thermal barrier between the first region of the pedestal and the second region of the pedestal.

13. The substrate support assembly of claim 9, further comprising a second purge channel defined along an interface between the stem and the pedestal, and configured to provide a second purge flow path producing a thermal barrier between the stem and the pedestal.

14. The substrate support assembly of claim 13, wherein the pedestal further comprises a purge distribution plate at least partially defining the second purge channel.

* * * * *